United States Patent
Benisek et al.

(10) Patent No.: US 6,850,414 B2
(45) Date of Patent: Feb. 1, 2005

(54) ELECTRONIC PRINTED CIRCUIT BOARD HAVING A PLURALITY OF IDENTICALLY DESIGNED, HOUSING-ENCAPSULATED SEMICONDUCTOR MEMORIES

(75) Inventors: Martin Benisek, München (DE); Martin Schober, Gröbenzell (DE)

(73) Assignee: Infineon Technologies AG, Munich (DE)

( * ) Notice: Subject to any disclaimer, the term of this patent is extended or adjusted under 35 U.S.C. 154(b) by 374 days.

(21) Appl. No.: 10/187,763

(22) Filed: Jul. 2, 2002

(65) Prior Publication Data

US 2003/0002262 A1 Jan. 2, 2003

(30) Foreign Application Priority Data

Jul. 2, 2001 (DE) .......................................... 101 31 939

(51) Int. Cl.[7] ........................... H05K 1/00; H05K 1/18; H05K 1/16; H05K 7/02; H05K 7/06
(52) U.S. Cl. ........................ 361/748; 361/760; 174/260
(58) Field of Search ................................ 361/728–730, 361/735, 736–737, 748, 749, 760, 763, 767, 768, 807, 808, 785, 788, 790, 791, 803; 257/693, 684, 679, 678; 711/301; 714/773; 365/51–52, 63; 174/250, 253, 255–256, 260

(56) References Cited

U.S. PATENT DOCUMENTS

| | | | | |
|---|---|---|---|---|
| 4,656,605 A | * | 4/1987 | Clayton ........................ | 365/52 |
| 5,572,457 A | * | 11/1996 | Michael ........................ | 365/52 |
| 6,208,546 B1 | * | 3/2001 | Ikeda ........................... | 365/51 |
| 6,222,739 B1 | * | 4/2001 | Bhakta et al. .............. | 361/790 |
| 6,492,714 B1 | * | 12/2002 | Kasatani ..................... | 257/678 |
| 6,725,414 B2 | * | 4/2004 | Seyyedy ..................... | 714/773 |
| 6,784,526 B1 | * | 8/2004 | Mezawa ..................... | 257/679 |

OTHER PUBLICATIONS

Internal Publication: "PC SDRAM Serial Presence Detect (SPD) Specification", Intel, Revision 1.2B, Nov., 1999, pp. 1–30.
Internal Publication: "PC SDRAM Registered DIMM Design Support Document", Intel, Revision 1.2, Oct., 1998, pp. 1–61.
Internal Publication: "133 MHz PC SDRAM 64–Bit Non–ECC/Parity 144 Pin Unbuffered SO–DIMM Specification", Intel, Revision 1.0C, Aug., 2000, pp. 1–30.
Internal Publication: "Platinenlayout Nr. ASE0015 im Gerber–Format" [Mounting Plate–Layout No. ASE0015 in Gerber–Format], IBM, picture 1.

* cited by examiner

Primary Examiner—Phuong T. Vu
(74) Attorney, Agent, or Firm—Laurence A. Greenberg; Werner H. Stemer; Ralph E. Locher

(57) ABSTRACT

An electronic printed circuit board has a memory module and a contact strip for insertion into another electronic unit. The memory module has at least nine identically designed housing-encapsulated integrated semiconductor memories configured on the printed circuit board. The longer dimension of the housing of one of the semiconductor memories, which is connected as an error correction chip, is oriented perpendicular to the contact strip. The longer dimension of the housings of the other semiconductor memories are oriented parallel to the contact strip. The different orientation of the semiconductor memories makes it possible to reduce the height of the printed circuit board while enabling the rectangular housings to keep the same physical form.

8 Claims, 3 Drawing Sheets

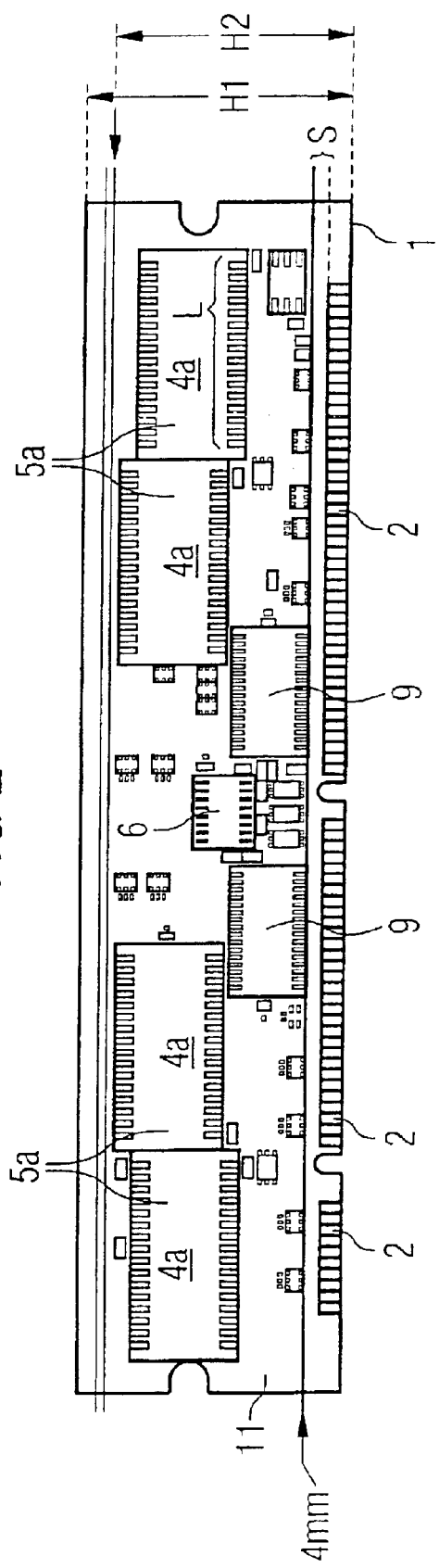

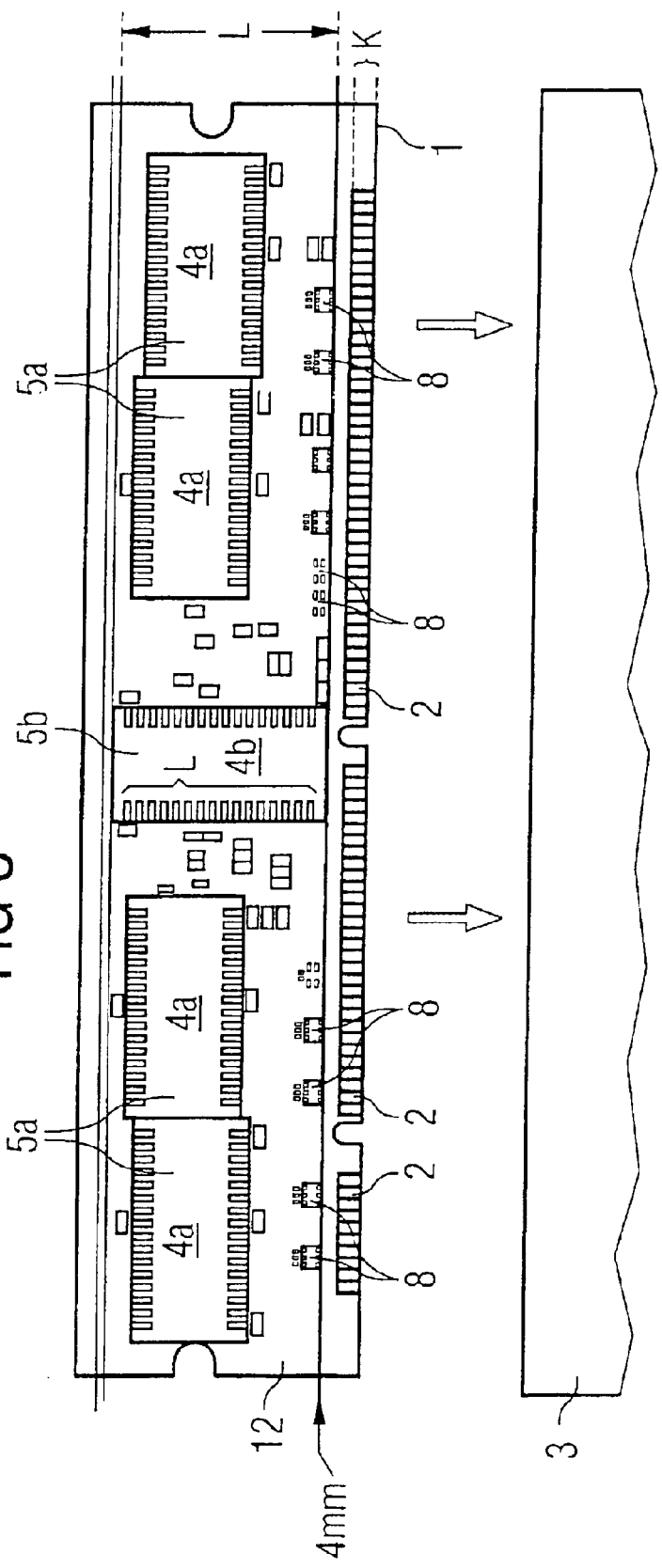

ELECTRONIC PRINTED CIRCUIT BOARD HAVING A PLURALITY OF IDENTICALLY DESIGNED, HOUSING-ENCAPSULATED SEMICONDUCTOR MEMORIES

BACKGROUND OF THE INVENTION

Field of the Invention

The invention relates to an electronic printed circuit board, which has a memory module and a contact strip that can be inserted into another electronic unit. The memory module has at least nine identically designed integrated semiconductor memories encapsulated in identically designed rectangular housings. The housings are each individually connected to the printed circuit board. One of the semiconductor memories is connected as an error correction chip on the printed circuit board and the rectangular housing of that memory is arranged on the printed circuit board in a manner such that the longer dimension is oriented perpendicular to the contact strip.

Printed circuit boards of this type are inserted into motherboards of personal computers or network computers and serve as the main memory, for example. In network computers, the printed circuit boards are inserted into compartment-type elements having a small height, for which reason the printed circuit boards themselves should also have only a small height (the dimension perpendicular to the contact strip). Therefore, compared with their width, which is essentially determined by the length of the contact strip, insertable printed circuit boards are not very high so that the compartment-type elements can be made very flat.

The height of a printed circuit board essentially depends on the dimensions of the largest components arranged on the printed circuit board. The largest components that are arranged on a printed circuit board are generally housings for semiconductor chips containing integrated circuits. The connections of the semiconductor chips are connected by the housing to corresponding contacts on the printed circuit board that are significantly larger than the chip connections. The housings themselves are also much larger than the integrated circuits and thus concomitantly determine the minimum height of the printed circuit board. In the case of printed circuit boards which carry memory modules, the largest housings are those for semiconductor memories, for example, for SDRAMS (synchronous dynamic random access memories). The housings therefore have a rectangular form and are always arranged on the printed circuit board vertically, i.e they are oriented with their longer dimension perpendicular to the contact strip.

The reason for this arrangement is that one of the semiconductor memories is used as an error correction chip in order to perform error checking on data that will be stored in the rest of the semiconductor memories or that will be read from the memories. The error correction chip is arranged approximately in the center of the contact strip, is arranged above the contact strip, and is arranged vertically, i.e. with the longer dimension of its housing at right angles to the contact strip, because of prescribed lengths of the conductor tracks which connect the error correction chip to the contact strip.

The rest of the semiconductor memories are arranged on both sides of the error correction chip and also on the front and rear sides of the printed circuit board in the same orientation as the error correction chip, so that all of the identically designed semiconductor memories are lined up along the contact strip in a conventional arrangement. The contact strip has electrical contacts on the front side and also on the rear side of the printed circuit board. Equally, the housing-encapsulated semiconductor memories are present both on the front side and on the rear side of the printed circuit board. Only a single error correction chip is provided and is situated, for example, on the front side of the printed circuit board.

In addition to further semiconductor chips that are encapsulated in smaller housings than the memory chips and that are arranged in proximity to the center of the contact strip, the printed circuit board has further, still smaller components, primarily passive components such as resistors and capacitors. In particular, many resistors are arranged in the outer regions of the contact strip. The resistors require a short connection to corresponding contacts of the contact strip.

By contrast, the housing-encapsulated semiconductor memories arranged in the outer regions of the contact strip are arranged at a somewhat larger distance from the contact strip, since their leads to the contact strip are permitted to be longer than the leads of the passive components to the contact strip.

The distance of all of the semiconductor memories from the contact strip is chosen in a uniform fashion, so that the vertically arranged memory housings concomitantly determine a certain minimum height of the printed circuit board. This is composed of the longer dimension of a memory housing, the height of resistors that are arranged between the housings and the contact strip, the height of the contact strip itself, and possibly a safety clearance between the contact strip and the components on the printed circuit board. This safety clearance serves, in the event of a slightly inclined attitude of the printed circuit board during insertion into motherboards, to protect the nearest components on the printed circuit board from mechanical damage, and is chosen to be as small as possible.

In the case of this conventional arrangement, in which the edges of the memory housings lined up along the contact strip are aligned, there is no more leeway for a further reduction of the circuit board height (the height of the printed circuit board perpendicular to the contact strip).

SUMMARY OF THE INVENTION

It is accordingly an object of the invention to provide an electronic printed circuit board having a memory module and a contact strip that can be inserted into another electronic unit, in which the printed circuit board overcomes the above-mentioned disadvantages of the prior art apparatus of this general type.

In particular, it is an object of the invention to reduce the height of the printed circuit board still further while using the same memory housings.

With the foregoing and other objects in view there is provided, in accordance with the invention, an electronic printed circuit board configuration including: an electronic printed circuit board having a contact strip for insertion into another electronic unit; and a memory module having at least nine identically designed integrated semiconductor memories. Each one of the semiconductor memories is encapsulated in a rectangular housing having a shorter dimension and a longer dimension. The housing of each one of the semiconductor memories is identically designed and is individually connected to the printed circuit board. One of the semiconductor memories is connected as an error correction chip. The longer dimension of the housing of the error correction chip is oriented perpendicular to the contact strip. The longer dimension of the housing of each one of the semiconductor memories, other than the error correction chip, is oriented parallel with the contact strip.

The object of the invention is achieved by virtue of the fact that, in the case of the printed circuit board of the generic type, the housings of the identically designed semiconductor memories, other than the error correction chip, are arranged on the printed circuit board in a manner such that they are oriented with their longer dimension parallel to the contact strip.

The housings of the semiconductor memories, which are identically designed, and therefore, all have the same dimensions, are arranged on the printed circuit board with a different orientation. While the semiconductor memory that is to be connected up as the error correction chip is still arranged vertically in order to comply with the specifications for the conductor track lengths of its leads, the rest of the identically designed semiconductor memories are arranged horizontally, that is to say parallel to the contact strip. In this position, the longer dimension of the rectangular housings extend parallel to the contact strip, and each horizontally oriented semiconductor memory requires a smaller circuit board height than in the case of a vertical orientation. The semiconductor memory that is used as the error correction chip and that concomitantly determines the height of the printed circuit board still requires the same space and thus actually, moreover, the original circuit board height.

However, this semiconductor memory, and this is something that is exploited according to the invention, is the only one that can be brought still closer to the contact strip, since no resistors have to be arranged between it and the contact strip. As a result, the board height is reduced by the distance that is taken up by the resistors that are arranged between the memory housings and the contact strip. Although these resistors are present over the outer regions of the contact strip on the printed circuit board, the semiconductor memories that are arranged horizontally overall lie closer to the contact strip, since they are narrower horizontally. The semiconductor memory used as the error correction chip can be brought up to the contact strip by the distance that is required by the resistors arranged in the outer regions of the contact strip.

This results in a certain, albeit small, narrowing of the printed circuit board. In many cases, however, this suffices to actually enable the incorporation into network computers.

A preferred embodiment provides for the semiconductor memories to be arranged such that the housing of the error correction chip extends, as seen from the contact strip, through to a greater distance from the contact strip than the housings of the other identically designed semiconductor memories. In this case, the horizontally oriented semiconductor memories are brought so close to the resistors at the contact strip that they do not require the printed circuit board to have a larger height than that required by the error correction chip that is brought up to the contact strip. This exploits the maximum space saving that can be obtained by using the invention.

Accordingly, in a preferred embodiment, the printed circuit board has a height that is perpendicular to the contact strip and that is composed of the sum of the longer dimension of a rectangular housing, the length of a contact of the contact strip and a safety clearance between the error correction chip and the contact strip of less than 2 mm. Accordingly, the error correction chip is brought up to the contact strip in a manner that leaves a slight safety clearance. The safety clearance serves for, in the event that the printed circuit board is placed in an inclined position during the insertion or withdrawal from a motherboard, for example, avoiding damage to the housing of the error correction chip (or further modules arranged in the same proximity to the contact strip). It goes without saying that the safety clearance can be reduced to the amount that is still just required.

The printed circuit board preferably has a height of 1 to 1.2 inches perpendicular to the contact strip. The height of a printed circuit board is the length of the edge of the printed circuit board—considered from the direction of the printed circuit board area—which extends perpendicularly to the contact strip. By contrast, the length of the edge parallel to which the contact strip runs is called the board width. The board height is generally quite smaller than the board width. The dimension of the printed circuit board perpendicular to its surface is referred to, not as the height of the printed circuit board, but rather as the printed circuit board thickness.

The housings of the identically designed semiconductor memories are preferably TSOP housings (thin small outline packages). These are standardized housings of predetermined dimensions (thin small outline package). Using the present invention, the height of the printed circuit board can be further reduced even when these housings continue to be used.

In a further preferred embodiment, the memory module has nine identically designed semiconductor memories. This embodiment allows high utilization of the printed circuit board area in the case of a symmetrical arrangement when two identically designed semiconductor memories are configured on each side of the error correction chip on both the front side and also on the rear side of the printed circuit board.

In a preferred embodiment, the printed circuit board is configured according to the standard of the PC 133 SDRAM registered DIMM design specification, raw card A or raw card F. This standard relates to the type of interconnection of the individual components of the memory module and the individual contacts of the contact strip. This standard defines length specifications of about 800 conductor tracks that are laid on the printed circuit board, except for permissible length tolerances. This standard furthermore contains specifications concerning the thickness of conductor tracks, concerning the approximate course of conductor tracks and also the time windows for the temporal sequence of signal transmissions. The raw cards A and F, special standard groups within the PC 133 SDRAM registered DIMM design specification, are defined for printed circuit boards that already have a very small height anyway. Using the present invention, even printed circuit boards that are configured according to these standard groups can be narrowed further.

Finally, the printed circuit board has a width of 5.25 inches. This board width has gained acceptance in the case of memory module boards.

Other features which are considered as characteristic for the invention are set forth in the appended claims.

Although the invention is illustrated and described herein as embodied in an electronic printed circuit board having a plurality of identically designed, housing-encapsulated semiconductor memories, it is nevertheless not intended to be limited to the details shown, since various modifications and structural changes may be made therein without departing from the spirit of the invention and within the scope and range of equivalents of the claims.

The construction and method of operation of the invention, however, together with additional objects and

BRIEF DESCRIPTION OF THE DRAWINGS

FIG. 2 shows the front side of an inventive printed circuit board; and

FIG. 3 shows the rear side of the printed circuit board shown in FIG. 2.

DESCRIPTION OF THE PREFERRED EMBODIMENTS

Figure 1A:
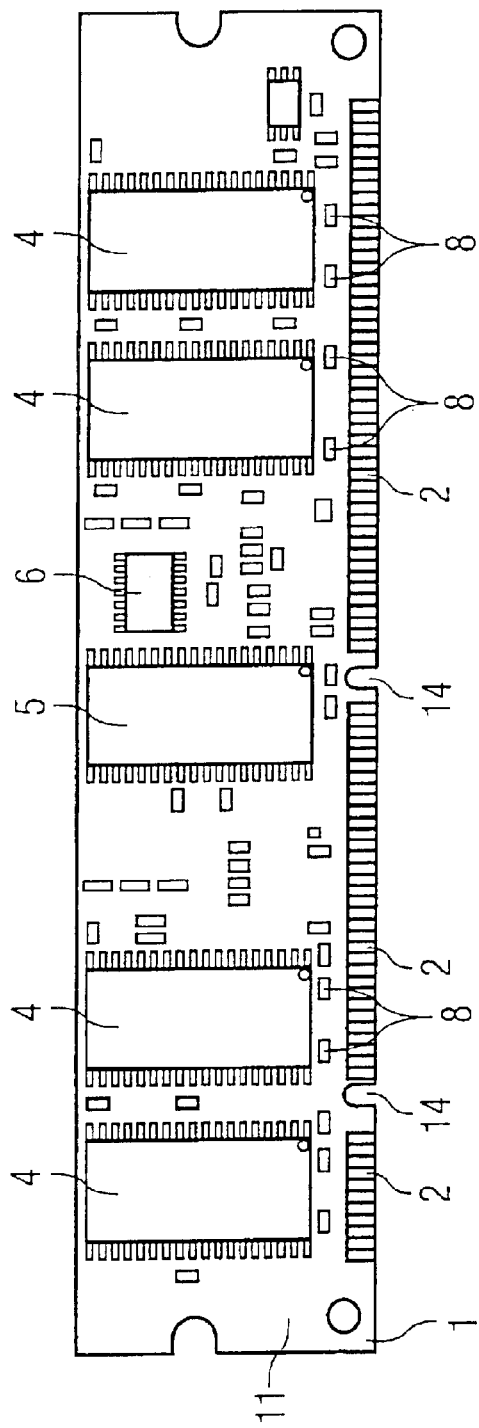
FIG. 1A shows the front side of a conventional printed circuit board.
Figure 1B:
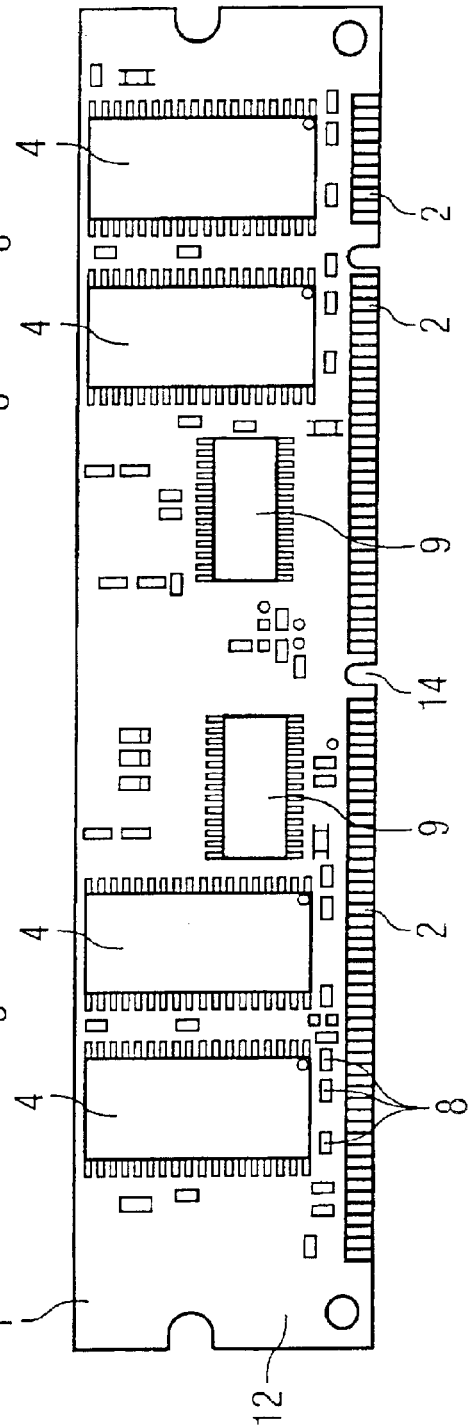
FIG. 1B shows the rear side of the conventional printed circuit board.

Referring now to the figures of the drawing in detail and first, particularly, to FIG. 1A thereof, there is shown a plan view of the front side 11 of a conventional printed circuit board 1 having, at its lower edge, a contact strip 2 interrupted by two indentations 14. If the printed circuit board is rotated about a vertical axis extending through the right-hand indentation 14, then the rear side 12 of the printed circuit board becomes visible. The rear side is illustrated in FIG. 1B. The front side 11 and the rear side 12 overlap in a mirror-inverted fashion, so that the left-hand half of the front side 11 corresponds to the right-hand half of the rear side 12.

The printed circuit board 1 has a number of memory chips 4 on both printed circuit board areas 11, 12 and also has a further identically designed chip, which is used as an error correction chip 5. Furthermore, further semiconductor modules are present, for example two register chips 9, with which memory addresses in the memory chips 4 are amplified synchronously, and a clock synchronization chip 6—also called PLL (phase locked loop)—for matching the memory module to an external clock frequency. Each of these semiconductor modules is encapsulated in a housing that connects the connections of the semiconductor module to significantly larger contacts of the printed circuit board. The dimensions of the housings are standardized, in which case, of all the semiconductor modules 4, 5, 6 arranged on the printed circuit board, the memory modules 4, 5 have the largest housings. For this reason, the size of their housings is determinative of the required height of the printed circuit board. In FIG. 1, the housings for the respective semiconductor modules 4, 5, 6 are designated by the reference symbols of the semiconductor modules themselves, since the housings determine their space requirement on the printed circuit board.

On the conventional printed circuit board 1 illustrated in FIG. 1, all of the semiconductor memories 4 are arranged on the printed circuit board vertically, i.e. such that the longer dimension of their rectangular housings is oriented perpendicular to the extent of the contact strip 2. The semiconductor memories are thus lined up parallel to one another on the front side and the rear side of the printed circuit board along the extent of the contact strip 2. In this arrangement, the smaller edges of the housings of the semiconductor memories 4 and 5 are aligned, i.e. all the memory modules 4, 5 are arranged in a line. They are all situated at the same distance from the contact strip 2. This distance is predetermined by the width of the resistors 8 that are arranged in between the contact strip 2 and the memory modules 4, 5 and by the mechanically dictated or thermally dictated safety clearances on both sides of the resistors 8. In each case, two of these resistors 8 must be arranged between one semiconductor memory 4 and the contact strip 2, because the upper limit for the length of the leads of the resistors from the contact strip 2 permits no other arrangement.

The contact strip 2, the resistors 8, the larger dimension of the housings of the semiconductor memories 4, 5 and also certain safety clearances between these together produce the required board height of this conventionally configured printed circuit board.

FIG. 2 shows the front side 11 of an inventive printed circuit board. FIG. 3 shows the rear side 12 of the printed circuit board and diagrammatically shows, an electronic unit 3, for example a motherboard, into which the contact strip 2 of the printed circuit board 1 can be inserted.

FIGS. 2 and 3 show the front side 11 and the rear side 12 of a printed circuit board 1 configured according to the invention. The identically designed semiconductor memories are designated by 4a, 4b and their likewise identically designed housings are designated by 5a, 5b.

On the printed circuit board that is populated according to the invention, as shown by FIGS. 2 and 3, the housings 5a of those semiconductor memories 4a which are not connected up as the error correction chip are arranged horizontally on the printed circuit board 1, i.e. the respective longer dimension L of the rectangular housings 5a runs parallel to the extent of the contact strip 2. Only the housing 5b of the error correction chip 4b is arranged vertically and takes up the same printed circuit board height as on a conventional printed circuit board. However, the housing of the error correction chip is brought up to the contact strip 2 as close as possible. This is possible because, between the error correction chip or its housing 5b and the contact strip 2, there is no need to arrange any passive components. In particular, there is no need for any resistors 8, as in the case of all of the other identically designed semiconductor memories 4a that are configured horizontally. By contrast, these semiconductor memories 4a take up for themselves a significantly smaller printed circuit board height than when in the vertical orientation, so that the actual printed circuit board height is determined only by the error correction chip 4b that is brought up to the contact strip 2.

As a result, the height of the printed circuit board can be reduced from a value $H_1$ to a smaller value $H_2$ composed of the longer dimension L of the identically-designed housings 5b, the length K of the contacts of the contact strip 2 (in the direction of the double arrow to L), and a safety clearance S between the contacts of the contact strip and the resistors 8. This reduction of the printed circuit board height enables incorporation into even flatter elements of e.g. network computers.

The printed circuit board illustrated in FIGS. 2 and 3 is populated in such a way that it can be connected up in accordance with the raw card A or raw card F of the standard "PC 133 SDRAM registered DIMM design specification" (133 MHz; dual inline memory module). It has a height of between 1 and 1.2 inches between the lower edge, at which the contact strip 2 is situated, and the upper edge.

The remainder of the components illustrated and their functions correspond to the prior art. The memory modules 4a, 4b are SDRAMs (synchronous dynamic random access memory modules). They are encapsulated in TSOP housings (thin small outline package) 5a, 5b.

The clock synchronization chip 6 (PLL; phase locked loop) ensures that, after a few clock cycles of the clock signal that is output from the electronic unit 3 via the contact strip 2 to the memory modules of the printed circuit board 1, the latter can operate synchronously with the motherboard.

Data that is transported to the semiconductor memory modules 4*a* always contain check data. The error correction chip, namely memory module, 4*b* checks the correctness of the data before the data are passed on.

A wide variety of methods are known according to which the error correction chip, namely memory module, 4*b* can operate. An example that shall be mentioned here is the ECC method (error correcting code), in which a check bit is added to eight bits of data to be communicated.

FIG. 2 furthermore shows two register chips 9, with which the memory addresses in the memory chips 4 are amplified synchronously.

All of the components situated on the printed circuit board are connected to one another and to the contact strip by conductor tracks. At the present time, printed circuit boards usually have six different conductor track planes lying one above the other in which the conductor tracks are arranged. The course of the conductor tracks is configured according to a suitable raw card of the above standard. The conductor tracks are not illustrated in the figures since their specific course is not essential with regard to the present invention.

We claim:

1. An electronic printed circuit board configuration, comprising:

an electronic printed circuit board having a contact strip for insertion into another electronic unit; and a memory module having at least nine identically designed integrated semiconductor memories;

each one of said semiconductor memories being encapsulated in a rectangular housing having a shorter dimension and a longer dimension;

said housing of each one of said semiconductor memories being identically designed and being individually connected to said printed circuit board;

one of said semiconductor memories being connected as an error correction chip;

said longer dimension of said housing of said error correction chip being oriented perpendicular to said contact strip; and said longer dimension of said housing of each one of said semiconductor memories, other than said error correction chip, being oriented parallel with said contact strip.

2. The printed circuit board according to claim 1, wherein:

said housing of said error correction chip extends a greater distance away from said contact strip than said housing of each one of said semiconductor memories, other than said error correction chip.

3. The printed circuit board according to claim 1, wherein:

said contact strip has a contact with a length;

said printed circuit board has a height extending perpendicular to said contact strip; and said height of said printed circuit board is equal to a sum of said longer dimension of said housing of said error correction chip, said length of said contact of said contact strip and a safety clearance between said error correction chip and said contact strip of less than 2 mm.

4. The printed circuit board according to claim 1, wherein:

said printed circuit board has a height of 1 to 1.2 inches perpendicular to said contact strip.

5. The printed circuit board according to claim 1, wherein:

said housing of each one of said semiconductor memories is a TSOP housing.

6. The printed circuit board according to claim 1, wherein:

said at least nine semiconductor memories define exactly nine semiconductor memories.

7. The printed circuit board according to claim 1, wherein:

said printed circuit board is configured according to a specification selected from a group consisting of a raw card A of a PC 133 SDRAM registered DIMM design specification and a raw card F of the PC 133 SDRAM registered DIMM design specification.

8. The printed circuit board according to claim 1, wherein:

said printed circuit board has a width of 5.25 inches.

* * * * *